(12) United States Patent
Menzel et al.

(10) Patent No.: US 12,228,618 B2
(45) Date of Patent: Feb. 18, 2025

(54) SYSTEMS AND METHODS FOR IDENTIFYING AND MANAGING STRESS CONDITIONS, RISK STATE OR AGING STATE ASSOCIATED WITH CAPACITORS

(71) Applicant: Schneider Electric USA, Inc., Andover, MA (US)

(72) Inventors: Johannes Menzel, Saint Hilaire du Touvet (FR); Ravindra Kulkarni, Bengaluru (IN); Jean-Marc Lupin, Pers-Jussy (FR)

(73) Assignee: Schneider Electric USA, Inc., Andover, MA (US)

( * ) Notice: Subject to any disclaimer, the term of this patent is extended or adjusted under 35 U.S.C. 154(b) by 132 days.

(21) Appl. No.: 18/083,393

(22) Filed: Dec. 16, 2022

(65) Prior Publication Data

US 2023/0194631 A1  Jun. 22, 2023

Related U.S. Application Data

(60) Provisional application No. 63/293,037, filed on Dec. 22, 2021.

(51) Int. Cl.
*G01R 31/12* (2020.01)
*G01R 31/64* (2020.01)

(52) U.S. Cl.
CPC .................. *G01R 31/64* (2020.01)

(58) Field of Classification Search
CPC .......... G01R 31/64; G01D 3/08; G01D 3/028
See application file for complete search history.

(56) References Cited

U.S. PATENT DOCUMENTS 10,637,108 B1  4/2020  Kaplan et al.
2009/0231764 A1*  9/2009  Banting .................... H02H 7/16
  340/638
2013/0119923 A1*  5/2013  Wright .................... H02J 7/345
  320/166

(Continued)

FOREIGN PATENT DOCUMENTS

WO  1999013348 A1  3/1999

OTHER PUBLICATIONS

International Search Report and Written Opinion for Application No. PCT/US2022/53227 dated May 26, 2023.

*Primary Examiner* — Thang X Le
(74) *Attorney, Agent, or Firm* — Troutman Pepper Locke LLP

(57) ABSTRACT

Systems and methods for identifying and managing stress conditions, risk state or aging state associated with capacitors associated with electrical equipment in an electrical power system are disclosed herein. In one aspect, a method for identifying and managing stress conditions, risk state or aging state associated with at least one capacitor includes detecting at least one of motion of and sounds associated with the at least one capacitor, and analyzing at least the detected at least one of motion of and sounds associated with the at least one capacitor to identify possible stress conditions, risk state or aging state associated with the at least one capacitor and associated components. In response to identifying possible stress conditions, risk state or aging state, probable impacts of the possible stress conditions, risk state or aging state on the at least one capacitor and associated components may be determined.

31 Claims, 7 Drawing Sheets

(56) References Cited

U.S. PATENT DOCUMENTS

| | | | | |
|---|---|---|---|---|
| 2014/0114592 A1* | 4/2014 | Eilertsen | ............... | G01R 31/64 |
| | | | | 702/58 |
| 2015/0083477 A1* | 3/2015 | Lee | ............... | H01G 4/30 |
| | | | | 361/301.4 |
| 2018/0003751 A1* | 1/2018 | Berkcan | ............... | G01R 31/371 |
| 2018/0164383 A1* | 6/2018 | Hsieh | ............... | H01M 10/486 |
| 2020/0106137 A1 | 4/2020 | Murphy et al. | | |
| 2020/0251788 A1 | 8/2020 | Sood et al. | | |
| 2021/0088580 A1 | 3/2021 | Coyne et al. | | |

\* cited by examiner

SYSTEMS AND METHODS FOR IDENTIFYING AND MANAGING STRESS CONDITIONS, RISK STATE OR AGING STATE ASSOCIATED WITH CAPACITORS

CROSS REFERENCE TO RELATED APPLICATION

This application claims the benefit of and priority to U.S. Provisional Application No. 63/293,037, filed on Dec. 22, 2021, which application was filed under 35 U.S.C. § 119(e) and is incorporated by reference herein in its entirety.

FIELD

This disclosure relates generally to capacitors, and more particularly, to systems and methods for identifying and managing stress conditions, risk state or aging state associated with capacitors.

BACKGROUND

As is known, capacitors are used in a variety of devices and applications. For example, in electronic circuits, capacitors may be used for blocking direct current while allowing alternating current to pass. Additionally, in analog filter networks, capacitors may be used to smooth the output of power supplies. Further, in resonant circuits capacitors may be used tune radios to particular frequencies, and in electric power transmission systems, they stabilize voltage and power flow. In electrical power systems, power capacitors are used for improving the system power factor by reactive power. Capacitors are connected either as Fixed capacitors or Switched capacitors, for example, depending upon the application. Metallized Poly-propylene (MPP) capacitors, which is one example type of capacitor, have gained popularity because of their inherent self-healing property. Self-healing is a property by which in case of di-electric breakdown inside the capacitor, localized evaporation of metal around the breakdown area takes place, thereby isolating the weak spot. The capacitor will continue to work normally in the service after self-healing.

As is known, capacitors, like other components, have an expected operational life. This expected operational life may be reduced (sometimes significantly reduced) in response to various stress conditions (environmental or otherwise). These stress conditions (e.g., over-temperature, over-voltage, voltage or current harmonics or over-current conditions) may impact operation of the capacitors (e.g., the controller may disconnect the capacitor bank and so not contribute to correct the power factor anymore) and cause safety concerns (e.g., capacitor explosions and harmful fires).

SUMMARY

Described herein are systems and methods related to identifying stress conditions, risk state or aging state associated with capacitors and associated components, for example, to increase operational life of the capacitors and associated components and to reduce (or ideally eliminate) safety hazards linked to the capacitors and associated components. In accordance with some embodiments of this disclosure, the disclosed systems and methods use unconventional techniques, such as analyzing detected motion and/or sounds (e.g., clicking sounds) associated with the capacitors, to identify possible stress conditions, risk state or aging state that may impact the life expectancy and/or operation of the capacitors and associated components. Actions (e.g., decoupling of components, alarms and/or notifications, initiation of cooling, etc.) may be taken to reduce or eliminate the possible stress conditions, and improve safety and/or operation of the capacitors and components. The capacitors may be installed in, coupled to and/or associated with one or more electrical devices/equipment, for example. For example, in a Power System application, such as in an industrial site or in a Power distribution network, the one or more capacitors may be provided in a capacitor bank. A goal of installing a capacitor bank in the Power System application may, for example, be to correct the Power Factor and, thus, to avoid paying the utility penalty due to the Power Factor.

In one aspect of this disclosure, a method for identifying and managing stress conditions, risk state or aging state associated with at least one capacitor associated with electrical equipment in an electrical power system includes at least one of the motion sensing device and the acoustic sensing device detecting at least one of motion of and sounds associated with the at least one capacitor, and analyzing at least one of the detected at least one of motion and sounds to identify possible stress conditions, risk state or aging state (e.g., defects due to vibration, higher temperature, voltage harmonics, ongoing events—such as resonance between two capacitor banks with one in low voltage and the other in medium voltage, etc.) associated with the at least one capacitor and associated components (e.g., electrical components proximate to and/or coupled to the capacitor(s)). In response to identifying possible stress conditions, risk state or aging state, probable impacts (e.g., aging or reduction of expected life, increased maintenance requirements, etc.) of the possible stress conditions, risk state or aging state on the at least one capacitor and associated components may be determined, and at least one action may be taken to reduce or eliminate the possible stress conditions, risk state or aging state based, at least in part, on the determined impacts. This may prevent or reduce safety related issues, concerns and/or failures, for example.

In accordance with some embodiments of this disclosure, at least one of a motion sensing device (e.g., motion capture device) and an acoustic sensing device (e.g., vibration sensor, microphone, etc.) may be coupled (e.g., fixedly or removably coupled) to at least one surface of or proximate to (e.g., on a surface near) the at least one capacitor or a room environment proximate to the at least one capacitor prior, to detecting the at least one of motion of and sounds associated with the at least one capacitor. For example, in one example implementation, the at least one of the motion sensing device and the acoustic sensing device may be provided in a capacitor bank enclosure such as a switchboard, panel board, cell, etc. In another example implementation, the at least one of the motion sensing device and the acoustic sensing device need not be installed on any particular surface. For example, the at least one of the motion sensing device and the acoustic sensing device may be hanging on a stand or other suitable object, such as a microphone stand.

In a further example implementation, the at least one of the motion sensing device and the acoustic sensing device may be provided inside the at least one capacitor, such as for detecting vibrations from within the at least one capacitor. For example, the at least one of the motion sensing device and the acoustic sensing device may be mounted on an interior surface of the case or enclosure (e.g., cylindrical like enclosure) of the least one capacitor and/or on one or more components inside the at least one capacitor for detecting the vibrations. Various possible mounting schemes will be apparent to one of ordinary skill in the art. Additionally, it is understood that other types of sensor devices (i.e., in addition to the motion sensing device and the acoustic sensing device, such as pressure sensing devices) may be provided interior or exterior to the at least one capacitor for sensing and monitoring various parameters associated with the at least one capacitor). The sensor devices may be or include wired sensor devices in some embodiments. Additionally, the sensor devices may be or include wireless sensor devices in other embodiments. In embodiments in which the sensor devices are or include wireless sensor devices, for example, the wireless sensor devices may detect at least one of motion of and sounds associated with the at least one capacitor, and be able to wirelessly communicate data (e.g., value(s), signal(s), etc.) indicative of the detected at least one of motion of and sounds associated with the at least one capacitor to at least one processing device using one or more available wireless communication protocols, as will be appreciated from further discussions below.

In one example implementation, frequencies of occurrence of the sounds associated with the at least one capacitor are analyzed to identify the possible stress conditions, risk state or aging state associated with the at least one capacitor and associated components. Additionally, in one example implementation, pitches and waveforms of the sounds associated with the at least one capacitor are analyzed to identify the possible stress conditions, risk state or aging state associated with the at least one capacitor and associated components. In one example implementation, the at least one acoustic sensing device used to detect the sounds includes at least one transducer (e.g., microphone) configured to convert detected sounds associated with the at least one capacitor to corresponding electrical signals or conditions. The electrical signals may be analyzed, for example, to identify the possible stress conditions, risk state or aging state of the at least one capacitor. In one example implementation, the sounds associated with the at least one capacitor are preprocessed such as for example being amplified by at least one amplification device (e.g., an amplifier) prior to being detected by the at least one acoustic sensing device. In one example implementation, the at least one amplification device is positioned proximate to (e.g., on a surface near) the at least one capacitor.

In one example implementation, the detected motion and/or sounds are analyzed to identify predictive patterns and/or abnormalities. The predictive patterns and/or abnormalities may be used, for example, to identify the possible stress conditions, risk state or aging state.

In one example implementation, the at least one action taken to reduce or eliminate the possible stress conditions, risk state or aging state includes decoupling one or more capacitors of the at least one capacitor from an electrical system including the at least one capacitor (e.g., for protection or safety of the capacitor(s) and/or other associated components). Additionally, in one example implementation, the at least one action includes triggering at least one alarm to indicate the possible stress condition(s). In accordance with some embodiments of this disclosure, the at least one triggered alarm may be communicated audibly and/or visually (e.g., on a display device of a system user and/or operator). In accordance with some embodiments of this disclosure, one or more actions may be taken (e.g., automatically, semi-automatically and/or manually) in response to the at least one triggered alarm. For example, in one example implementation, at least one cooling device (e.g., fan, liquid cooling mechanism, etc.) may be responsive to the at least one triggered alarm to reduce temperature of the at least one capacitor in response to the at least one triggered alarm indicating an over-temperature condition associated with the at least one capacitor. In accordance with some embodiments of this disclosure, this would be particularly useful in embodiments in which more than one capacitor in a capacitor bank including the at least one capacitor shows the same or similar over heating condition. Another possible example would be to switch to another capacitor within the capacitor bank and to switch off the currently used capacitor.

For example, referring again to the cooling action(s), a control signal may be generated in response to determining at least one action should or must be taken to reduce or eliminate the possible stress conditions (e.g., the above-noted over-temperature condition), risk state or aging state, and the at least one cooling device may be responsive to the control signal to provide cooling to reduce temperature of the at least one capacitor. In accordance with some embodiments of this disclosure, the control signal may be generated by a control system and/or another system or device. The control system and/or other system or device may be coupled to, or include, or be provided in a sensing system or device (e.g., system for identifying and managing stress conditions, risk state or aging state associated with at least one capacitor, the at least one motion and/acoustic sensing device, etc.).

In another example implementation of the disclosed invention, an alarm (or alarms) may be initiated or triggered to reduce or eliminate the possible stress conditions, risk state or aging state. For example, the alarm (or alarms) may take the form of at least one of an audible indicator and visual indicator, and be used to request or initiate a maintenance request (e.g., by services team).

It is understood that while the above and below described systems and methods are described as detecting and analyzing motion and/or sounds to identify the possible stress conditions, risk state or aging state, other types of measurements may be detected/measured and analyzed to identify the possible stress conditions, risk state or aging state. For example, in accordance with some embodiments of this disclosure, it is contemplated that current(s) and/or voltage(s) associated with the above and below discussed at least one capacitor may be measured, and the measured current(s) and/or voltage(s) may be analyzed to identify the possible stress conditions, risk state or aging state. The current(s) and/or voltage(s) may be measured, for example, by at least one current and/or voltage sensing device electrically coupled to the at least one capacitor. In one example implementation, the measured current(s) is/are analyzed for decreases in current over time (in similar running conditions such as similar voltage(s) and temperature conditions for example), with the decreases in current over time are indicative of a possible stress condition, risk state or aging state. In another example the capacitance or Kilovolt-amperes reactive (kvar) are derived from the voltage and current measurements and used to determine the aging and risk state of the capacitor and so trigger appropriate action. In another example illustration the phase angles shifts may be measured to determine state changes. In again another example illustration, the maximum magnitude as well as the energizing duration before stable periods will be measured and used as features extracted from the current and voltages per phases, to infer a state of aging as well as and evaluation of the risk level to determine what action should be taken when.

Additionally, in accordance with some embodiments of this disclosure, it is contemplated that temperature(s) associated with the at least one capacitor and/or associated components are measured, and the measured temperature(s) is/are analyzed to identify the possible stress conditions, risk state or aging state (e.g., the above-noted over-temperature condition) associated with the at least one capacitor and/or associated components. The temperature(s) may be measured, for example, by at least one temperature sensing device within, on the surface or proximate to the surface of the at least one capacitor and/or associated components. In one example implementation, the measured temperature(s) is/are analyzed for increases in temperature over time, with the increases in temperature over time being indicative of a possible stress conditions, risk state or aging state (or conditions).

It is also contemplated that smells of the at least one capacitor and/or associated components may be monitored (e.g., using an electrochemical nose), and the monitored smell(s) may be analyzed to identify the possible stress conditions, risk state or aging state associated with the at least one capacitor and/or associated components. For example, the electrochemical nose (and/or other smell/odor sensor) may use pattern recognition to recognize, identify, and compare odors. The odors/smells (e.g., intensity(ies) and/or type(s) of odors/smells) may be indicative of possible stress conditions, risk state or aging state associated with the at least one capacitor and/or associated components in some embodiments. It is understood that many other means of detecting possible stress conditions, risk state or aging state are also contemplated, as will be appreciated by one of ordinary skill in the art. In accordance with some embodiments, such sensors may be included in each one of the capacitors and/or associated components, or within the group of capacitors. The sensors may additionally or alternatively be present in an environment (e.g., enclosure) including the at least one capacitor. For example, such an odor may be indicative of capacitor aging or risk associated to capacitors state if the capacitor could be degraded or even melting (if not metal), as well as indicative of at least one metal cannot being air and pressure proof/tight (leaking pressure, so gas flowing out of can).

In accordance with some embodiments of this disclosure, it is also contemplated that the internal pressure of the at least one capacitor and/or associated components may be monitored (e.g., using any pressure sensor), and the monitored pressure variation(s) may be analyzed to identify the possible stress conditions, risk state or aging state associated with the at least one capacitor and/or associated components. For example, pressure variation(s) detected by at least one pressure sensor may be compared to acceptable pressure levels and a protection mechanism may be triggered when a certain threshold is reached or when a certain pattern appears (such as fast increasing pressure level).

In accordance with some embodiments of this disclosure, monitored pressure variation(s) may also be used to detect unsealed capacitors. This is very important as non-pressure-tight capacitors will most probably fail with some conventional protection mechanism which may be based on a mechanically triggered electrical disconnection protection mechanism. The principle of such a pressure based mechanism is very simple: In an air-tight capacitor, the pressure builds up by each occurrence of a very localized default in the film (such phenomena has been documented and is standard state of the art in film based capacitors). When the pressure continues to build up, at a given level, a lid pops and disconnects the electrical wire from the capacitor. This given pressure level may be reached very slowly, over a long period of time or when a period of accelerated wear appear (due to some contextual augmented stress factors such as temperature increase, specific voltage harmonics, capacitor bank resonances). In any case, after a period of pressure increase, the assumption is that the capacitor is air-tight. If this is not the case, then the capacitor is at risk of not being protected by the pressure-based disconnection protection device. Accordingly, the key is to detect if the capacitor is not air-tight. In this case the capacitor will have a leak in some place, either from quality issue at the manufacturing stage, or due to handling or installation (e.g., after a shock due to an accidental drop, or extreme temperature exposure which may crack some material). Detecting if a capacitor is not air-tight is very simple: If the relative pressure inside the device decreases over the following time period, this means the capacitor is not air-tight. The relative internal pressure is derived from a temperature context, as the measured pressure of gas will vary according to the capacitor temperature. Another way to keep a simpler lowest internal pressure threshold value which should not be reached by any measured pressure could be derived from a long non-functioning period. In this case, we have a reference to compare with. Again, another way is to compare the value of this one capacitor over a time period, with all siblings installed on the same capacitor bank. If these show no decrease in pressure in a similar operational mode (for example, after 6 hours of non-energized capacitors), while the one under evaluation shows a pressure decrease when compared to similar context measurements taken earlier, then the system may deduce that the capacitor leaks, and the system may disconnect this specific capacitor and tag it "to be replaced as not air-tight".

It is understood that several or all available sensors may be combined to enhance the accuracy and speed of detecting such a "not air-tight" capacitor. For example, if one pressure sensor installed within the capacitor as well as a temperature sensor (within or installed on the surface or in proximity of the surface) provide both temperature and pressure, the system will be able to deduce a curve of the pressure according to the temperature of the capacitor. This may even be modeled according to the time as a third dimension, incorporating a thermal inertia. At this point, as pressure should only be stable or increase relative to the given temperature and time of this temperature, the system may deduce that the capacitor is "not air-tight".

The temperature sensors may also be implemented in the controller, under the condition that this still provides a good accuracy of the local temperature of the operational temperature of the capacitor(s).

The typical utility interval duration mean, max and min logged current or power measurements will also be provided by the controller and when available, a timer since last end of energizing for each of the capacitors. This will enable the system to evaluate when any comparison may be done and how to normalize the pressure measurements according to the operational temperature.

Internal pressure measurements may be leveraged as well to detect mal-functioning physical protection mechanism. In the previous idea, we focused on detecting "pressure leakage" from an individual capacitor. This would result (as described) in a risk of explosion. Yet, if we continue to walk down the line of possible failure modes, there could be another failure which could be detected: If no "pressure leakage" is detect, but at a given pressure the protection mechanism did not operate, we may deduce a possible mechanical failure/mal-function of the protection mechanism. In this case the "protection mal-function" should trigger compensating action, such as for example among many possible actions: At the controller level, disconnect and not re-use this capacitor until maintenance replacement action was validated. Or trigger an internal to the capacitor physical protection mechanism to definitely dis-connect electrically this capacitor (to avoid any accidental possible re-use of this capacitor).

Normally the gas (and pressure) should be able to spread within the capacitor. By design, the gas pressure should be able to move through the foil layers and in certain cases, a designed "perforated tube" is present in the center of the capacitor to enable direct spread of the gas and help any pressure to spread to the protection mechanism (which may be located at the upper part of the capacitor, where the lid of the capacitor is situated. But sometimes, due to combination of factors, gas may be trapped in one specific location in the capacitor. In this case, pressure may build up until a rupture point for the "containment pocket" of the gas is attained in terms of pressure. In a worst-case scenario, an explosion may result out of this due to non-activated cumulative pressure-based protection mechanism. The idea here is to detect such gas trapped abnormal condition in "local pockets".

It is understood that many different methods may be used to detect the gas trapped abnormal condition. For example, one simple method would be to use at least two different pressure sensors: One would be installed on or in proximity of the cumulative pressure based protection mechanism (such as in the top section of the capacitor, attached to the lid for example). The other would be in the middle section of the capacitor. Remark, more than two sensors may be used. In such a case, the additional sensors would be spread across the section of the capacitor in height or positioned in other significant positions within the capacitor (e.g., each range may have its own architecture, and so its own "weak spots" to be monitored by sensors). Or even in the width if embedded into the film. At this point several models may trigger a protection. The quick appearance of high differential of pressure is a first indication. In this case, the controller may take preventive action by temporarily switching this capacitor "off" as soon as the differential pressure reaches beyond a certain threshold. This threshold may both be defined by default, and be tuned to each site or location or to a given process, to make possible any adaptation to the criticality of the site. The second step then checks if this differential pressure recedes, and at what speed (time to reach a normal situation which may be defined by a default max ratio of differential pressure). If the pressure never recedes, and the max pressure exceeds a certain ratio (default setting by manufacturing) then the controller may issue a warning of "detected sealed pressure pocket formation" and take required action such as for example permanently disconnecting and call for maintenance replacement of capacitor.

If the pressure recedes, then the controller may either re-activate the capacitor upon reaching an acceptable pressure at each point and/or differential pressure ratio between the sensors, or the controller may use a more advanced model to estimate the time to defuse the pressure and use this to both warn maintenance of the creation of such a "gas pocket" and also to leverage this to continue to cycle of using and disconnecting this particular capacitor to avoid any risk zone. Tracking end trending the evolution over time will enable a precise action (report and choice to disconnect permanently are two possible resulting actions provided as examples of possible actions, among many others.

Normally pressure and temperature have what can be considered a normal relationship and both should be able to spread within the capacitor and this can be defined by a physical model (e.g., by physical model derived from measurements and experiments, as is known state of the art in this field of physical modelling, showing the relation and progressive spread of increasing or decreasing temperature, as well as the spread of pressure, within a physical object such as a capacitor). As stated in above section, "sometimes, due to combination of factors, gas may be trapped in one specific location in the capacitor. In this case, pressure may build up until a rupture point for the "containment pocket" of the gas is attained in terms of pressure". Accordingly, another possible way to detect such a potentially dangerous situation would be by using temperature spread by using temperature sensors (inside or on predefined capacitor outside location(s)). By checking the measured temperature spread, the system is able to detect a localized heat/pressure pocket, which does not spread as normal conditions would expect. In this case the system would be able to immediately take action to avoid a dysfunction of the normal protection (the one based on pressure in the lid). Examples of possible actions could be: Momentarily or permanently disconnecting the capacitor if certain thresholds in the model are exceeded, or send you a warning if the model only deviates slightly, warning useful to attract attention in maintenance and have maintenance take a decision which could state the risk factor and track any resolution (e.g., self-healing by local rupture of the gas pocket) or any increase of potentially hazardous evolution of the pocket (e.g., an increase in the pressure and/or longer temperature propagation time within the capacitor towards other regions of the capacitor, or slower cooling down after de-energizing the capacitor). In embodiments in which signs indicate that an abnormal behavior may not trigger nominal case protection, a preventive action may be provided to reduce the risk by using in relation to nominal protection, and other sensors' data may be used to identify and evaluate a risk for not triggering the protection mechanism, and preventive actions may be provided in a graded by risk evaluation progressive manner.

In accordance with some embodiments of this disclosure, the above and below described at least one capacitor (or capacitor(s)) includes a plurality of capacitors. In accordance with some embodiments of this disclosure, the plurality of capacitors are provided in at least one capacitor bank. The plurality of capacitors may be arranged in serial, parallel or a combination thereof.

In accordance with some embodiments of this disclosure, the at least one capacitor is provided in an enclosure. The enclosure may correspond, for example, to an electrical switchboard including the at least one capacitor as well as a controller of the capacitor(s).

Systems for identifying and managing stress conditions, risk state or aging state associated with at least one capacitor is also provided herein. In one aspect of this disclosure, a system for identifying and managing stress conditions, risk state or aging state associated with at least one capacitor includes at least one of the motion sensing device and the acoustic sensing device coupled to at least one surface proximate to the at least one capacitor, and at least one processing device coupled to the at least one of the motion sensing device and the acoustic sensing device. The at least one of the motion sensing device and the acoustic sensing device is configured to detect motion of and sounds associated with the at least one capacitor, and the at least one processing device is configured to analyze at least the detected motion of and sounds associated with the at least one capacitor to identify possible stress conditions, risk state or aging state associated with the at least one capacitor and associated components. In response to identifying possible stress conditions, risk state or aging state, the at least one processing device may determine probable impacts of the possible stress conditions, risk state or aging state on the at least one capacitor and associated components and take at least one action to reduce or eliminate the possible stress conditions, risk state or aging state based, at least in part, on the determined probable impacts.

In accordance with some embodiments of this disclosure, the system for identifying and managing stress conditions, risk state or aging state further includes at least one control device coupled to the at least one processing device and the at least one capacitor. The at least one control device may be configured to perform a variety of functions. For example, in one example implementation the at least one control device may be configured to receive at least one control signal from the at least one processing device in response to the at least one processing device identifying the possible stress conditions, risk state or aging state. Additionally, the at least one control device may be configured to take the at least one action to reduce or eliminate the possible stress conditions, risk state or aging state in response to receiving the at least one control signal. The at least one action may include, for example, decoupling one or more capacitors of the at least one capacitor from electrical system(s) or device(s) including the at least one capacitor. Additionally, the at least one action may include triggering at least one alarm to indicate the possible stress conditions, risk state or aging state. Further, the at least one action may include sending at least one action command to at least one cooling device to reduce temperature of the at least one capacitor. The at least one cooling device may initiate cooling of the at least one capacitor, for example, in response to the at least one cooling device receiving the at least one action command. The at least one action command may take the form of at least one control signal, for example. It is understood that the above-described example actions are but a few of many possible actions that may be taken, as will be appreciated from further discussions in the Detailed Description section of this disclosure, for example.

In accordance with some embodiments of this disclosure, the at least one processing device includes the at least one control device. Additionally, in accordance with some embodiments of this disclosure, the at least one control device includes the at least one processing device. The at least one processing device may be or include at least one local processing device (e.g., local to the at least one capacitor) and/or at least one remote processing device (e.g., remote from the at least one capacitor).

The at least one processing device may take the form of an Intelligent Electronic Device (IED) in some instances. As used herein, an IED is a computational electronic device optimized to perform a particular function or set of functions. Examples of IEDs may include smart utility meters, power quality meters, microprocessor relays, digital fault recorders, and other metering devices. IEDs may also be imbedded in VSDs, uninterruptible power supplies (UPSs), circuit breakers, relays, transformers, or any other electrical apparatus. IEDs may be used to perform measurement/monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data (e.g., waveform data, logged data, I/O data, etc.) as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem/series. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

It is understood that the terms "processor" (and processing device) and "controller" (and control device) are sometimes used interchangeably herein. For example, a processor may be used to describe a controller. Additionally, a controller may be used to describe a processor.

It is also understood that an input is data that a processor (e.g., the above-discussed at least one processing device) and/or device (e.g., the above-discussed at least one control device) receives, and an output is data that a processor and/or device sends. Inputs and outputs (e.g., data indicative of detected motion and/or sounds) may either be digital (e.g., two states such as high/low, one/zero, on/off, etc.) or analog (e.g., continuously variable such as spatial position, temperature, pressure, energy, power, current, voltage, etc.).

Processors and/or devices may convert/reconvert digital and analog input signals to a digital representation for internal processing. Processors and/or devices may also be used to convert/reconvert internally processed digital signals to digital and/or analog output signals to provide some indication, action, or other response (such as an input for another processor and/or device).

Typical uses of digital outputs may include opening or closing breakers or switches, starting or stopping motors and/or other equipment, and operating other devices and equipment that are able to directly interface with digital signals. Digital inputs are often used to determine the operational status/position of equipment (e.g., is a breaker open or closed, etc.) or read an input synchronous signal from a utility pulsed output. Analog outputs may be used to provide variable control of valves, motors, heaters, or other loads/processes in energy management systems. Finally, analog inputs may be used to gather variable operational data (e.g., to determine for a given motor the different frequent operational stable running modes such torque or speed at a given load) and/or in proportional control schemes.

A few more examples where digital and analog input/output (I/O) data are leveraged to identify running loads affecting the power system (and so affecting voltages and current measurements) may include (but not be limited to): turbine controls, plating equipment, fermenting equipment, chemical processing equipment, telecommunications, equipment, precision scaling equipment, elevators and moving sidewalks, compression equipment, waste water treatment equipment, sorting and handling equipment, plating equipment temperature/pressure data logging, electrical generation/transmission/distribution, robotics, alarm monitoring and control equipment, as a few examples.

Data indicative of detected motion and/or sounds associated with the at least one capacitor, for example, may include I/O data. It is understood that the I/O data may take the form of digital I/O data, analog I/O data, or a combination digital and analog I/O data. The I/O data may convey status information, for example, and many other types of information, as will be apparent to one of ordinary skill in the art from discussions above and below. It may also be linked to stress conditions, risk state or aging state. As capacitor films used are known to be locally perforated (this is normal and known state of the art), every such local momentary short circuit will create a sound/motion which may be detected by a sound/motion sensor. The rate of these occurrences, their long term trends, can all be used to identify an abnormal stress conditions, risk state or aging state. This can be done by using expert and research defined thresholds (e.g., an absolute rate per 10 seconds, per minute, per hour, per day), they can be relative to each type of capacitor depending on the type of film used or specific to the used film type and/or manufacturer within a given capacitor. But this can also be a "relative model" to each capacitor, by learning its normal behavior over the first hours or days of operation (e.g., through statistical or other different machine learning methods such as neural networks for example). Any strong long term deviation (acceleration of the rate), or even worse, any very abrupt strong acceleration may then be used to evaluate the risk level and take appropriate action. Algorithms and tools typical for condition based monitoring may be leveraged as is known state of the art in asset management analytics.

It is understood that the systems and methods described herein may be responsive to changes in the system(s) or environment(s) in which the systems and methods are provided and/or implemented. For example, the type(s), number(s), location(s), etc. of sounds and/or motion detected in the system(s) or environment(s) may change in response to changes (e.g., addition of further capacitors, loads, cooling devices, etc.) in the system(s) or environment(s). The changes in the system(s) or environment(s) may be detected, for example, from the signals measured by sensing devices (e.g., acoustic and/or motion sensing devices) in the system(s) or environment(s) as well as in the controller (e.g., from the capacitor temperature sensors connected to the controller or even to the capacitors themselves). In one example implementation, the changes are detected after manually triggering a training/teaching period for a system to learn a "normal behavior". This "normal behavior" is a model which may be statistical (e.g., a $1^{st}$ or $3^{rd}$ quartile value +/− a bandwidth based on the interquartile ratio multiplied by a factor of 1.5 for any outlier detection, or by 3 if we want to reduce the number of false positives by detecting only extreme outliers) or could be any other type of model known in the state of the art (e.g., a deep learning model based on neural networks among many others) which in turn will then be used by the system to identify any appearing abnormal changes which should trigger a specific response. For example, the specific equipment (or processes) operating at a given time in a given context (e.g., a certain ambient temperature within the switchboard) may be run and the data measured to allow the system to learn (i.e., a form of machine learning).

It is understood that there are many other features and advantages associated with the disclosed invention, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
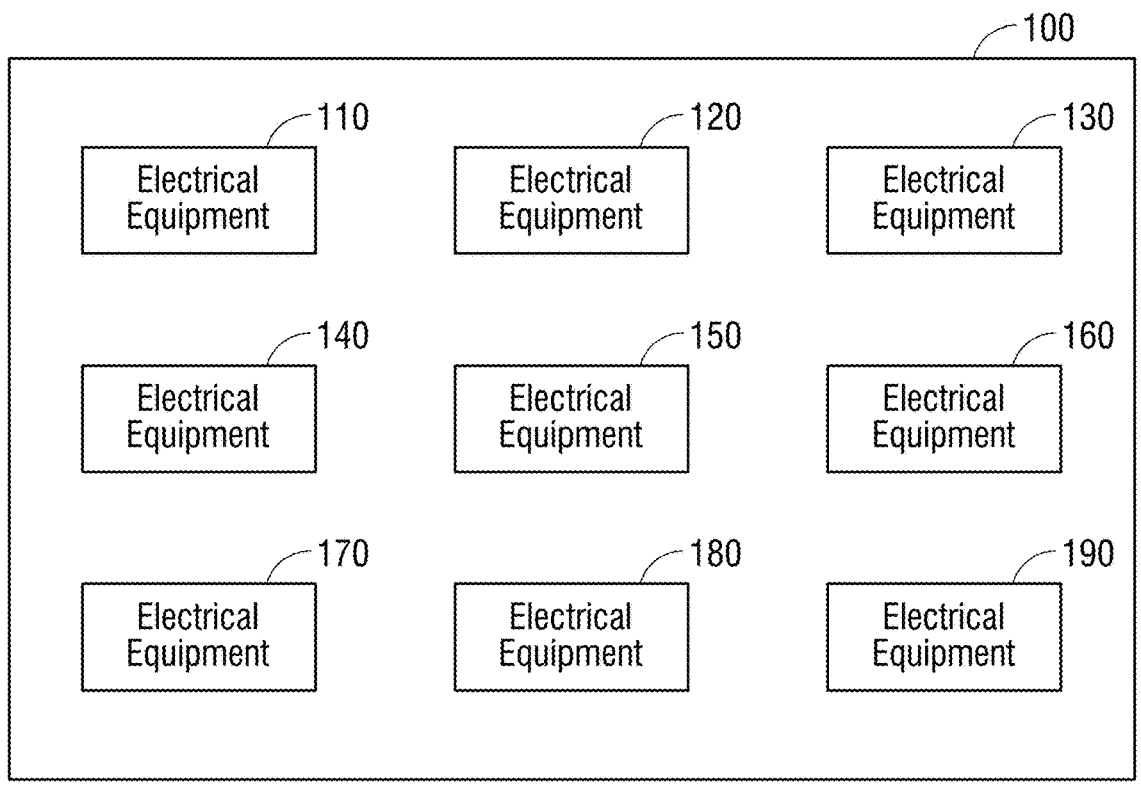
FIG. 1 shows an example electrical power system in accordance with embodiments of the disclosure.

Referring to FIG. 1, an example electrical power system 100 in accordance with embodiments of the disclosure includes a plurality of electrical equipment 110, 120, 130, 140, 150, 160, 170, 180, 190. The electrical equipment (or devices) 110, 120, 130, 140, 150, 160, 170, 180, 190 may be associated with a particular application (e.g., an industrial application), applications, and/or process(es). In some embodiments, the electrical equipment 110, 120, 130, 140, 150, 160, 170, 180, 190 may be installed or located in one or more facilities (i.e., buildings) or other physical locations (i.e., sites) associated with the electrical power system 100. The facilities may correspond, for example, to industrial buildings or plants. Additionally, the physical locations may correspond, for example, to geographical areas or locations.

The electrical equipment 110, 120, 130, 140, 150, 160, 170, 180, 190 may each be configured to perform one or more tasks in some embodiments. For example, at least one of the electrical equipment 110, 120, 130, 140, 150, 160, 170, 180, 190 may be configured to produce or process one or more products, or a portion of a product, associated with the electrical power system 100. Additionally, at least one of the electrical equipment 110, 120, 130, 140, 150, 160, 170, 180, 190 may be configured to sense or monitor one or more parameters (e.g., industrial parameters) associated with the electrical power system 100. For example, electrical equipment 110 may include or be coupled to a temperature sensor configured to sense temperature(s) associated with the electrical equipment 110, for example, ambient temperature proximate to the electrical equipment 110, temperature of a process associated with the electrical equipment 110, temperature of a product produced by the electrical equipment 110, etc. The electrical equipment 110 may additionally or alternatively include one or more pressure sensors, flow sensors, level sensors, vibration sensors and/or any number of other sensors and/or other devices (e.g., control devices), for example, associated the application(s) or process(es) associated with the electrical equipment 110. The application(s) or process(es) may involve water, air, gas, electricity, steam, oil, etc. in one example embodiment.

The electrical equipment 110, 120, 130, 140, 150, 160, 170, 180, 190 may take various forms and may each have an associated complexity (or set of functional capabilities and/or features). For example, electrical equipment 110 may correspond to a "basic" industrial equipment, electrical equipment 120 may correspond to an "intermediate" industrial equipment, and electrical equipment 130 may correspond to an "advanced" electrical equipment. In such embodiments, intermediate electrical equipment 120 may have more functionality (e.g., measurement features and/or capabilities) than basic electrical equipment 110, and advanced electrical equipment 130 may have more functionality and/or features than intermediate electrical equipment 120. For example, in embodiments electrical equipment 110 (e.g., electrical equipment with basic capabilities and/or features) may be capable of monitoring one or more first characteristics of an industrial process, and electrical equipment 130 (e.g., electrical equipment with advanced capabilities) may be capable of monitoring one or more second characteristics of the industrial process, with the second characteristics including the first characteristics and one or more additional parameters. It is understood that this example is for illustrative purposes only, and likewise in some embodiments the electrical equipment 110, 120, 130, etc. may each have independent functionality.

Figure 1A:
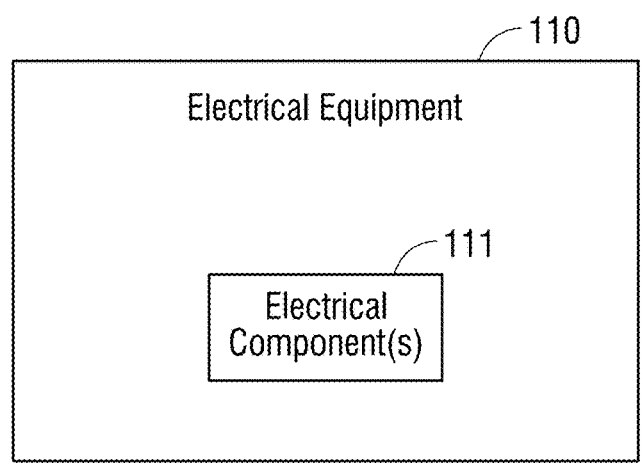
FIG. 1A shows an example electrical equipment including electrical components that may be subject to stress conditions, risk state or aging state.

As illustrated in FIG. 1A, which shows a simple example of electrical equipment 110, each piece of electrical equipment in an electrical power system (such as electrical power system 100 shown in FIG. 1) typically includes at least one electrical component (here, electrical component(s) 211). As is known, electrical equipment (e.g., power meters, protection devices, capacitor banks, transformers, loads such as motors, etc.) and its associated electrical components (e.g., resistors, capacitors, inductor, transistors, etc.) typically have associated operational ratings and limits, or ranges of operation, such as those pertaining to voltage level(s), current level(s), temperature, exposure to humidity, and/or chemical interactions, for example. Exposure to certain conditions beyond the electrical equipment's and associated electrical components' specified rating(s) (i.e., stress conditions, risk state or aging state) during shipping, storage, and/or use may, for example, adversely affect operation of the electrical equipment and associated electrical components and, thus, the reliability and accuracy of the electrical equipment and associated electrical components and the electrical power system including the electrical equipment and associated electrical components (e.g., electrical power system 100 shown in FIG. 1). For example, in embodiments in which electrical equipment 110 is a measurement circuit or device (e.g., an IED, such as a power meter, protection relay, etc.) used to measure or monitor one or more electrical parameters, and the electrical components 111 include measurement elements (e.g., resistors, capacitors, inductor, transistors, etc.) for measuring the parameters, deviations in accuracy of parameter measurements performed by the measurement elements (e.g., due to stress conditions, risk state or aging state) may impact the accuracy of the measurement circuit or device output. The foregoing may result in inaccurate parameter reporting by the measurement circuit or device, which may lead to device failure, energy waste and/or hazardous conditions (e.g., fires, explosions, etc.), for example.

With respect to capacitors, for example, which is one example type of electrical component, exposing capacitors to extreme operating conditions, including excessive ambient temperatures, humidity, temperature cycling, vibrations, shock, and lack of ventilation, may cause potential fire and explosion hazards to the capacitors and associated components (e.g., associated electrical measurement and control IEDs/components in a capacitor bank including the capacitors and the associated electrical equipment/components). Current solutions, such as U.S. Pat. No. 8,090,548, assigned to Schneider Electric, the same assignee as the present disclosure, measure temperature and amount of current flowing through capacitor to determine state of aging of capacitor (e.g., due to stress conditions, risk state or aging state). While the solution offered in U.S. Pat. No. 8,090,548, for example, is effective, it will be readily appreciated that improvements are continually needed. Accordingly, it is an object of the present invention to provide new approaches for identifying and managing stress conditions, risk state or aging state associated with capacitors.

Figure 2:
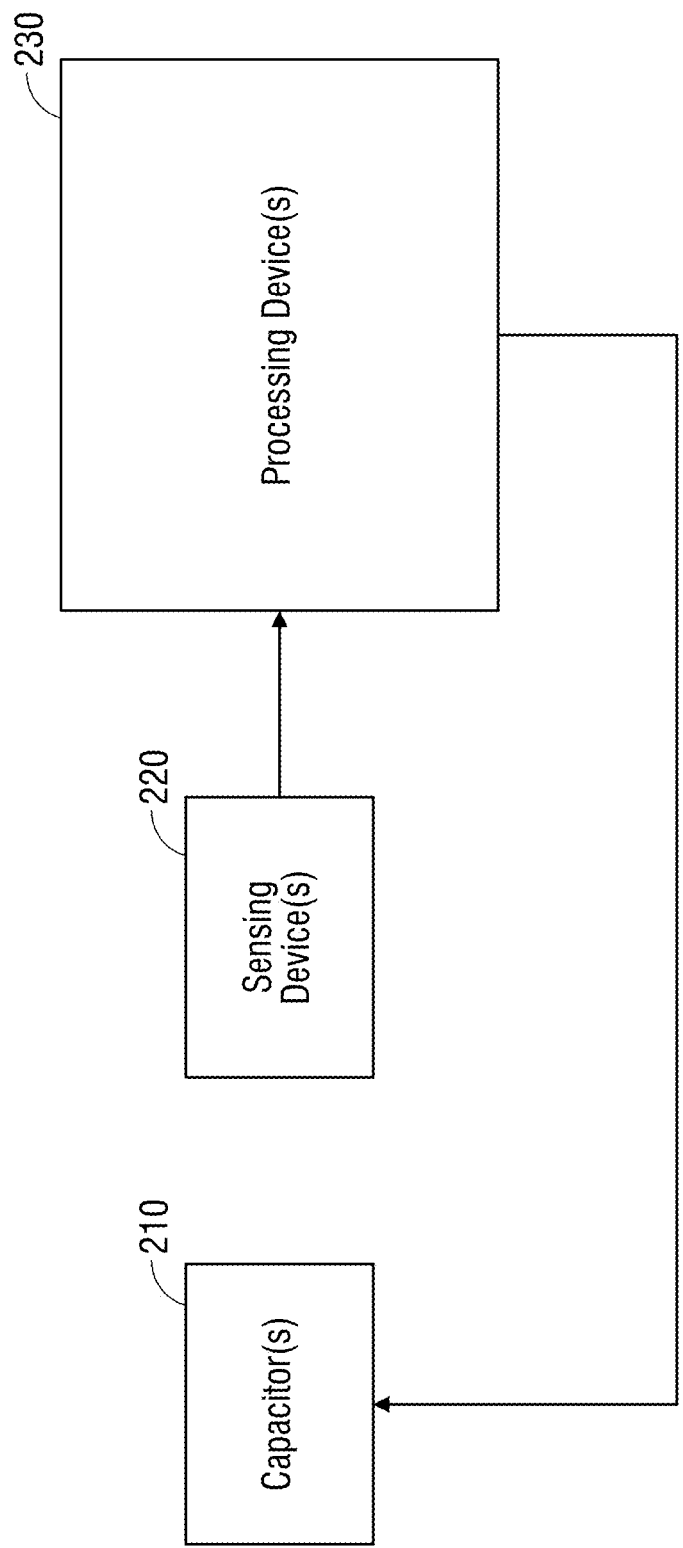
FIG. 2 shows an example system for identifying and managing stress conditions, risk state or aging state associated with at least one capacitor in accordance with embodiments of this disclosure.

Referring to FIG. 2, an example system for identifying and managing stress conditions, risk state or aging state associated with capacitors (here, at least one capacitor 210) in accordance with an embodiment of this disclosure is shown. As illustrated in FIG. 2, the system includes at least one sensing device 220 and at least one processing device 230 communicatively coupled to the at least one sensing device 220. In accordance with some embodiments of this disclosure, the at least one sensing device 220 is communicatively coupled to the at least one processing device 230 through a communications network, such as, a local area network, a wide area network, a combination thereof, or the like. Additionally, in accordance with some embodiments of this disclosure, the at least one sensing device 220 is communicatively coupled to the at least one processing device 230 through a wired or wireless link.

The at least one sensing device 220 is configured to sense or monitor one or more parameters associated with the at least one capacitor 210, and provide data indicative of the sensed or monitored parameters to the at least one processing device 230. Additionally, the at least one processing device 230 is configured to analyze the data to identify possible stress conditions, risk state or aging state associated with the at least one capacitor 210 and associated components (e.g., circuitry coupled to the at least one capacitor 210).

In one example implementation, the at least one sensing device 220 includes at least one of a motion sensing device and an acoustic sensing device and is configured to sense or monitor at least one of motion of and sounds (which are examples of sensed or monitored parameters) associated with the at least one capacitor 210. For example, the at least one of the motion sensing device (e.g., camera) and the acoustic sensing device (e.g., vibration sensor, microphone, etc.) may be coupled to at least one surface of or proximate to the at least one capacitor 210 or a room environment proximate to the at least one capacitor 210 to enable the at least one of the motion sensing device and the acoustic sensing device to detect the at least one of motion of and sounds associated with at least one capacitor 210. For example, the at least one of the motion sensing device and the acoustic sensing device may be coupled to a surface of a cabinet (e.g., a rackmount cabinet) in which the at least one capacitor 210 is provided. Further, the at least one of the motion sensing device and the acoustic sensing device may be coupled to a surface decoupled from the systems and/or devices including the at least one capacitor 210, for example, in embodiments in which the at least one capacitor 210 includes a plurality of capacitors provided in a variety of locations and the at least one of the motion sensing device and the acoustic sensing device is capable of monitoring the plurality of capacitors (i.e., the at least one capacitor 210) in the variety of locations. The plurality of capacitors may be provided in one or more capacitor banks, for example. The at least one of the motion sensing device and the acoustic sensing device may also be mounted on a microphone stand or stick inside the capacitor bank, for example. Other example configurations of the at least one of the motion sensing device and the acoustic sensing device are of course possible, as will be apparent to one of ordinary skill in the art.

In response to detecting the at least one of the motion of the sounds associated with at least one capacitor 210, the at least one of the motion sensing device and the acoustic sensing device may be configured to measure and then generate at least one of motion data and sound data indicative of the detected at least one of the motion and sounds. In accordance with embodiments of this disclosure, the at least one of the motion data and the sound data may take a variety of forms. For example, the at least one of the motion data and the sound data may take the form a signal or signals indicative of the detected at least one of the motion and the sounds. The signal or signals may be analog, digital or a combination thereof.

The at least one of the motion data and sound data, and/or data indicative of the at least one of the motion data and the sound data (e.g., information derived from the at least one of the motion data and the sound data such as direction(s) and frequency(ies) of motion, pitch of sound, spectral analysis features, trends, etc.), may be received by the at least one processing device 230 for processing. For example, the at least one processing device 230 may analyze the least one of the motion data and sound data, and/or the data indicative of the at least one of the motion data and sound data, to identify possible stress conditions, risk state or aging state associated with the at least one capacitor 210 and associated components (e.g., coupled to and/or associated with the at least one capacitor 210). For example, as noted throughout this disclosure, capacitors (such as the at least one capacitor 210) may be subject to stress conditions, risk state or aging state (e.g., vibrations, over or under temperature conditions, humidity, harmonics, etc.) which may impact operation of and safety of the capacitors and associated components. In accordance with some embodiments of this disclosure, the at least one processing device 230 may analyze the at least one of the motion data and the sound data generated by the at least one of the motion sensing device and the acoustic sensing device, and/or the data indicative of the at least one of the motion data and the sound data, to identify the possible stress conditions, risk state or aging state associated with the at least one capacitor 210 and associated components. In accordance with some embodiments of this disclosure, the possible stress conditions, risk state or aging state may be determined, for example, based on pattern analysis of the at least one of the motion data and the sound data, as will be described further in connection with figures below.

The at least one processing device 230 may also be configured to determine an impact (or impacts) of the possible stress conditions, risk state or aging state on the at least one capacitor 210 and the associated components. For example, each capacitor of the at least one capacitor 210, and the associated components, may respond differently to a given stress condition. For example, it is possible for a stress condition to significantly impact one capacitor or component (e.g., a capacitor or component proximate to a source of the stress condition), but have little or no noticeable impact on another capacitor or component (e.g., a capacitor or component a distance from the source of the stress condition). It is also possible for a stress condition to significantly impact one type of capacitor or component, but have little or no noticeable impact on another type of capacitor or component. One example of such type of capacitor type dependent difference of impact may be due to the material(s) and/or other properties of the case(s) or enclosure(s) of the capacitor(s) (e.g., a metal case that is air-tight vs. a plastic case that is not as air-tight as the metal case). For example, a plastic case may be impacted by operational context (such as for example by aggressive chemical environment, salt in air, humidity, etc.), while a metal case that is air-tight may not be subject to any of these stress factors. It is understood that the case or enclosure of each capacitor may take a variety of forms and shapes (e.g., have a cylindrical shape). Additionally, it is understood that the case or enclosure of each capacitor may be made from a variety of materials and have varying levels of air-tightness (e.g., depending on the application(s), cost(s) of the capacitor(s), and other specifications or requirements). Each of these properties or parameters may either directly or indirectly affect the susceptibility of the capacitor(s) to being impacted by the possible stress condition(s). In some instances, it may be desirable to quantify the impact(s) of the possible stress condition(s) on each capacitor of the at least one capacitor 210, and the associated components.

Figure 2A:
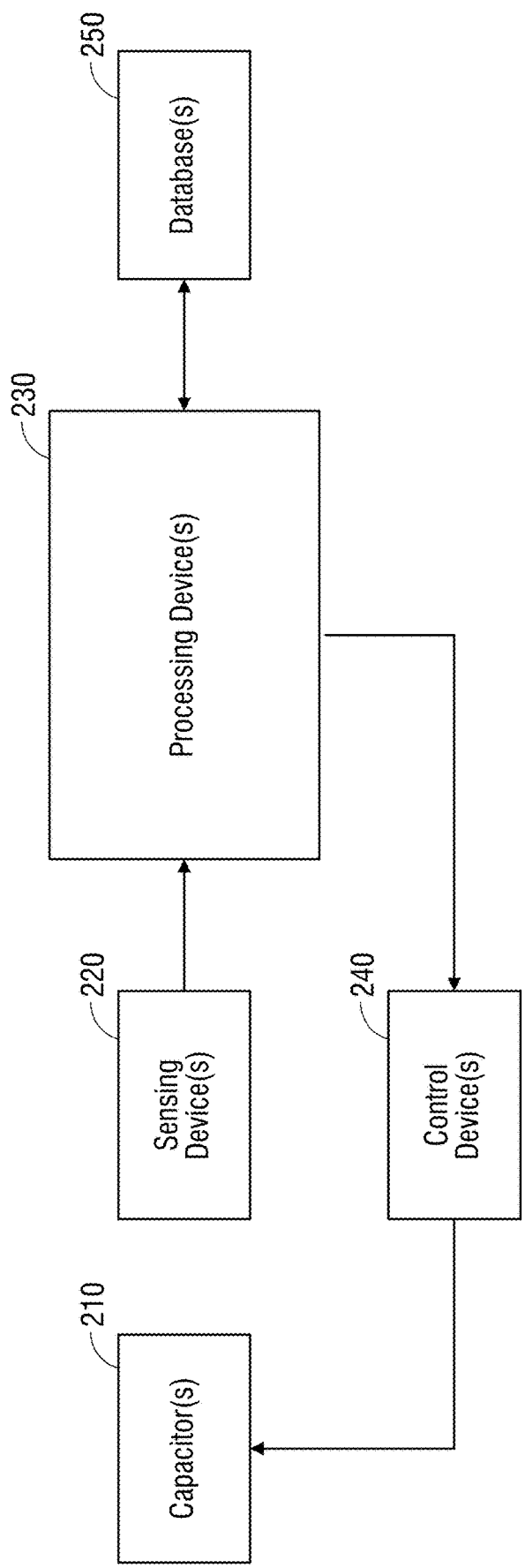
FIG. 2A shows another example system for identifying and managing stress conditions, risk state or aging state associated with at least one capacitor in accordance with embodiments of this disclosure.
Figure 2B:
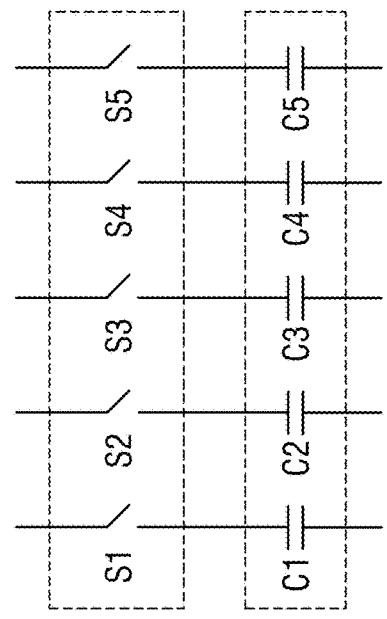
FIG. 2B shows an example switching circuit coupled to a capacitor bank including a plurality of capacitors in accordance with embodiments of this disclosure.

In accordance with some embodiments of this disclosure, the at least one processing device 230 is configured to take at least one action to reduce or eliminate the possible stress condition(s). For example, in one example implementation, the at least one action taken to reduce or eliminate the possible stress condition(s) includes decoupling one or more capacitors of the at least one capacitor 210 from an electrical system including the at least one capacitor (e.g., for protection or safety of the capacitor(s) and/or other associated components). For example, as illustrated in FIG. 2A, in accordance with some embodiments of this disclosure, the at least one processing device 230 may be coupled to at least one control device 240 (e.g., switching circuit), and the at least one control device 240 may be responsive to a control signal (or signals) generated by the at least one processing device 230 to decouple one or more capacitors of the at least one capacitor 210 to reduce or eliminate the possible stress condition(s) associated with the one or more capacitors. For example, in embodiments in which the at least one capacitor 210 includes a plurality of capacitors, the at least one control device 240 may selectively couple and decouple one or more of the capacitors (e.g., C1, C2, C3, C4, C5, as shown in FIG. 2B) via one or more switching devices (e.g., S1, S2, S3, S4, S5, as shown in FIG. 2B) to reduce or eliminate the possible stress condition(s) associated with the capacitors.

In accordance with some embodiments of this disclosure, the at least one action taken to reduce or eliminate the possible stress condition(s) (e.g., decoupling select capacitors), risk state or aging state may be determined, for example, based on an analysis of potential actions that may be taken to reduce or eliminate the possible stress condition (s), risk state or aging state. A listing of potential actions may, for example, be stored on at least one database 250 coupled to the at least one processing device 230. In one example implementation, the at least one processing device 230 may access and retrieve the listing of potential actions from the at least one database 250, and determine a best fit potential action (or actions) to reduce or eliminate the possible stress condition(s), risk state or aging state. In another example implementation, the at least one processing device 230 may learn potential actions based on a training data set supplied to the at least one processing device 230, for example, from the at least one database 250 and/or at least one user (e.g., system user or operator). The at least one user may provide the training data set from at least one user device, for example, a mobile device, tablet or personal computer. In one example implementation, such a training data set may be based on initial measurements taken weeks, months or years earlier. This initial data (for example, measurements over the first three months of operations) may be used to retrain a new version of the algorithm (for example, in case of changes in the number of layers specified). As such, the initial data may not reside in the memory, but may be reloaded for training purposes into an upgraded algorithm. It is understood that there are many possible potential actions that may be taken, and also many possible ways in which the potential actions may be determined/identified, as will be appreciated from further discussions below.

It is understood that the at least one processing device 230, the at least one control device 240, and the at least one database 250 may take a variety of forms. For example, in accordance with some embodiments of this disclosure, the at least one processing device 230 may include or be coupled to at least one cloud-based processing device. The computing resources comprising the at least one cloud-based processing device may be centralized in a single location, distributed throughout multiple locations, or a combination of both. Similarly, the at least one database 250 may include at least one cloud-based database in some embodiments. The at least one cloud-based database may be centralized in a single location, distributed throughout multiple locations, or a combination of both. The at least one control device 240 may also take a variety of forms, for example, as a switching device, as discussed above, or any other form that will be apparent to one of ordinary skill in the art. In accordance with some embodiments of this disclosure, the at least one control device 240 may be provided in a system (e.g., a capacitor monitoring system) including the at least one processing device 230, or separate from the system (i.e., the at least one control device 240 and the at least one processing device 230 may be provided in separate/different systems in some embodiments).

It is understood that the at least one sensing device 220 may be or include at least one wired sensor device (e.g., with the at least one sensing device 220 being wired to the at least one processing device 230 either directly or indirectly) in some embodiments. Additionally, the at least one sensing device 220 may be or include at least one wireless sensor devices in other embodiments. In embodiments in which the at least one sensing device 220 are or include wireless sensor devices, for example, the wireless sensor devices may detect the at least one of motion of and sounds associated with the at least one capacitor, and be able to wirelessly communicate the at least one of motion data and sound data indicative of the detected at least one of the motion and sounds to the at least one processing device 230 using one or more available wireless communication protocols. The wireless communication protocols may include, for example, at least one of Bluetooth, Zigbee, LoRaWAN, WiFi, HART protocol, WirelessHART, and Cellular wireless communication protocols. It is understood that the data may be directly communicated from the at least one sensing device 220 to the at least one processing device 230 in some instances. Additionally, it is understood that the data may be indirectly communicated from the at least one sensing device 220 to the at least one processing device 230 in other instances. For example, the data may initially be communicated from the at least one sensing device 220 to one or more intermediary devices (e.g., extender or data collection devices) and eventually be received by the at least one processing device 230 for processing.

It is understood that the systems shown in FIGS. 2 and 2A are but two of many potential configurations of systems for identifying and managing stress conditions, risk state or aging state associated with capacitors in accordance with embodiments of this disclosure. For example, while the systems are shown as including at least one processing device 230 and at least one control device 240 that are directly coupled to the at least one capacitor 210, in some embodiments the at least one processing device 230 and the at least one control device 240 may be indirectly coupled to the at least one capacitor 210 (e.g., via one or more intermediary systems and/or devices). It is understood that other configurations of systems for identifying and managing stress conditions, risk state or aging state associated with capacitors are possible.

Figure 3:
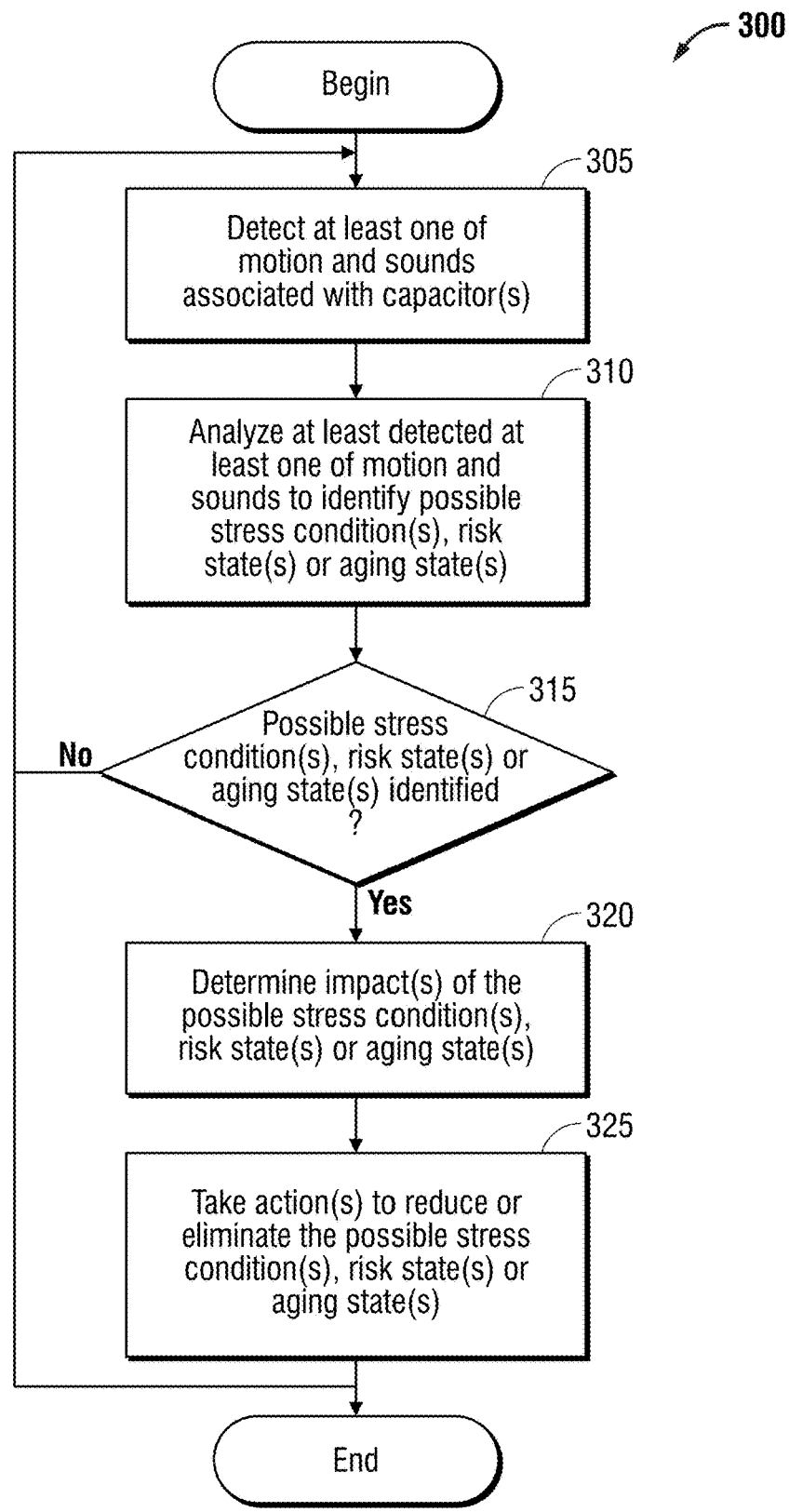
FIG. 3 is a flowchart illustrating an example implementation of a method for identifying and managing stress conditions, risk state or aging state associated with at least one capacitor in accordance with embodiments of this disclosure.
Figure 4:
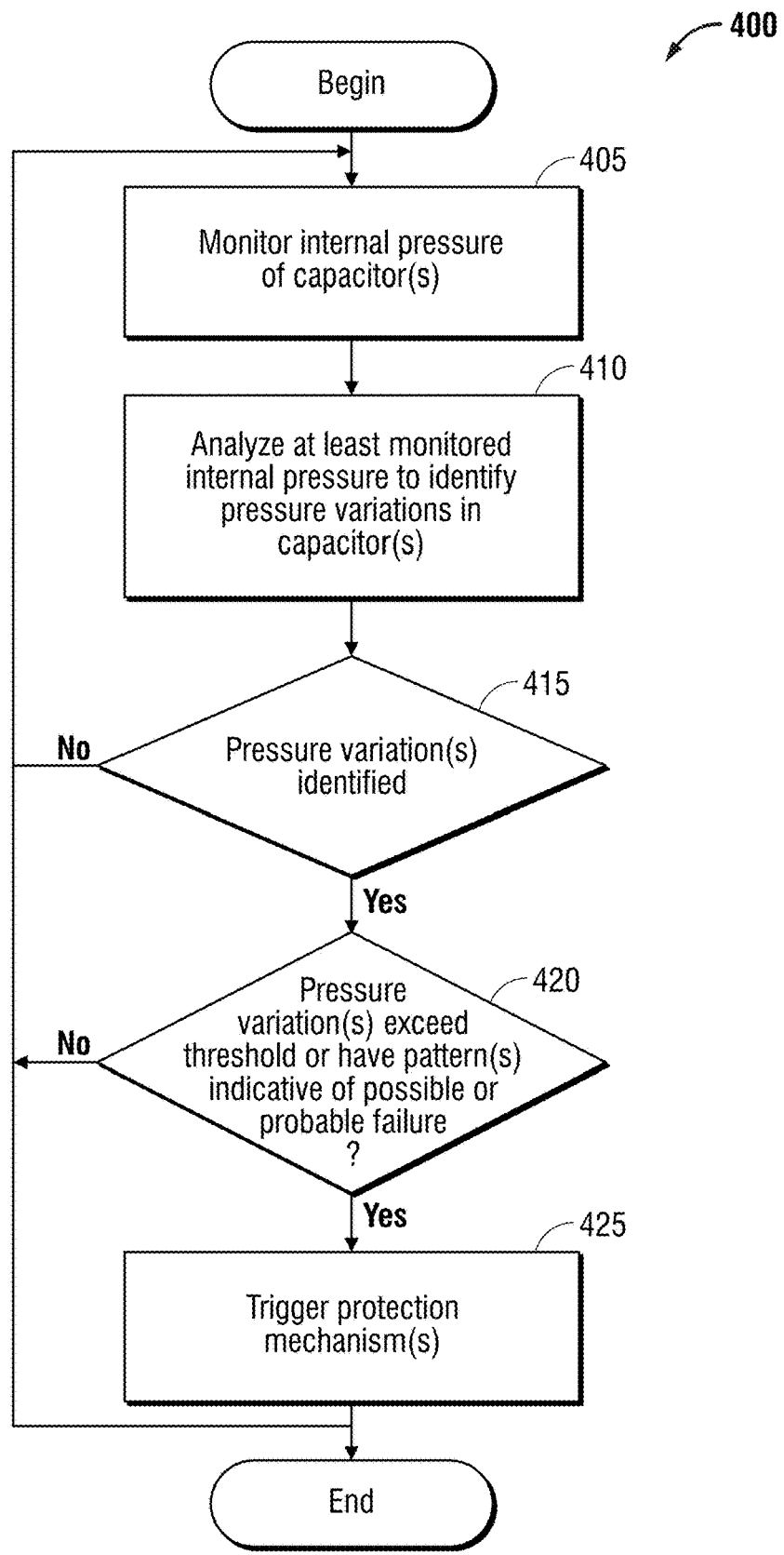
FIG. 4 is a flowchart illustrating another example implementation of a method for identifying and managing stress conditions, risk state or aging state associated with at least one capacitor in accordance with embodiments of this disclosure.

Referring to FIGS. 3 and 4, several flowcharts (or flow diagrams) are shown to illustrate example methods (here, methods 300, 400) of the disclosure relating to identifying and managing stress conditions, risk state or aging state associated with capacitors. Rectangular elements (typified by element 305 in FIG. 3), as may be referred to herein as "processing blocks," may represent computer software and/or IED algorithm instructions or groups of instructions. Diamond shaped elements (typified by element 315 in FIG. 3), as may be referred to herein as "decision blocks," represent computer software and/or IED algorithm instructions, or groups of instructions, which affect the execution of the computer software and/or IED algorithm instructions represented by the processing blocks. The processing blocks and decision blocks (and other blocks shown) can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously (e.g., run parallel on multiple processors and/or multiple IEDs) and vice versa. Additionally, the order/flow of the blocks may be rearranged and/or interchanged in some cases as well. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with identifying and managing stress conditions, risk state or aging state associated with capacitors sought to be protected by this disclosure. It is also understood that various features from the flowchart described below may be separated in some embodiments. For example, while the flowcharts illustrated in FIGS. 3 and 4 are shown having many blocks, in some embodiments the methods shown by these flowcharts may include fewer blocks or steps.

Referring to FIG. 3, a flowchart illustrates an example method 300 to identify and manage stress conditions, risk state or aging state associated with capacitors. In accordance with embodiments of this disclosure, method 300 may be implemented, for example, on at least one processing device (e.g., 230, shown in FIG. 2) coupled to at least one sensing device (e.g., 220, shown in FIG. 2) configured to sensor or monitor at least one capacitor (e.g., 210, shown in FIG. 2) associated with electrical equipment (e.g., 110, shown in FIG. 1) in an electrical power system (e.g., 100, shown in FIG. 1). The at least one processing device may be local to the at least one capacitor (e.g., on a same site as the at least one capacitor) and/or remote from the at least capacitor (e.g., associated a cloud-based system, on-site/edge software, a gateway, or another head-end system).

As illustrated in FIG. 3, the method 300 begins at block 305, where at least one of motion of and sounds associated with the at least one capacitor is detected. As discussed earlier in this disclosure, in accordance with some embodiments of this disclosure, the at least one of motion of and sounds associated with the at least one capacitor may be detected using at least one of a motion sensing device and an acoustic sensing device (e.g., 220, shown in FIG. 2). As also discussed earlier, in accordance with some embodiments of this disclosure, the at least one of the motion sensing device and the acoustic sensing device may be coupled to at least one surface of or proximate to the at least one capacitor or a room environment proximate to the at least one capacitor. For example, the at least one of the motion sensing device and the acoustic sensing device may be coupled to at least one surface of an enclosure (e.g., cabinet) and/or a circuit board including the at least one capacitor.

In embodiments in which at least one motion device (e.g., camera) is used, the at least one motion device may capture one or more images (e.g., still images or video streams) and at least one processor associated with the at least one motion device may perform image processing, such as motion detection, to detect motion associated with the at least one capacitor. The motion associated with the at least one capacitor may include, for example, motion by the at least one capacitor, motion of an enclosure including the at least one capacitor, and motion of other device/component/circuitry proximate to the at least one capacitor.

In embodiments in which at least one acoustic sensing device (e.g., microphone) is used, various sound information of interest may be detected by the at least one acoustic sensing device. For example, the at least one acoustic sensing device may detect sounds (e.g., clicking sounds) being emitted by the at least one capacitor, sounds being emitted in response to vibrations that the at least one capacitor and associated components may be subject to, environmental noise, etc. In some embodiments, the sounds associated with the at least one capacitor and associated components are amplified by at least one amplification device prior to being detected by the at least one acoustic sensing device.

At block 310, at least the detected at least one of the motion of and sounds associated with the at least one capacitor is/are analyzed to identify possible stress conditions, risk state or aging state (e.g., defects due to vibration, higher temperature, voltage harmonics, etc.) associated with the at least one capacitor and associated components. For example, frequencies of occurrence of the sounds may be analyzed to the identify the possible stress conditions, risk state or aging state. Additionally, pitches of the sounds may be analyzed to the identify the possible stress conditions, risk state or aging state. Motion (e.g., excess or sudden motion, rate of motion, etc.) of the at least one capacitor and associated components may also be analyzed to identify the possible stress conditions, risk state or aging state, as well as any inflection point (e.g., acceleration/higher frequency or volume/intensity of sound).

Figure 3A:
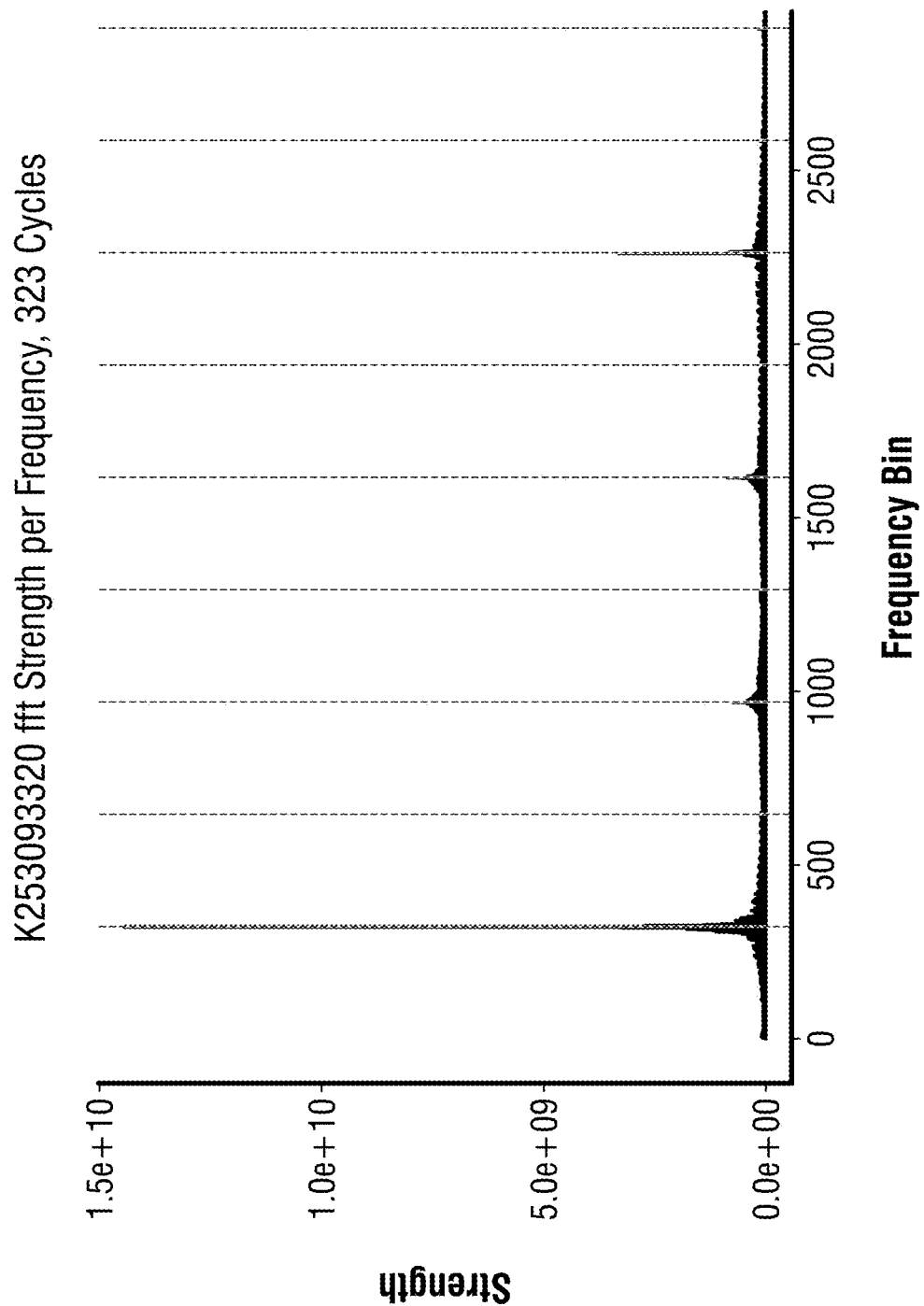
FIG. 3A shows an example Fourier analysis of an example signal in accordance with embodiments of this disclosure.

In accordance with some embodiments of this disclosure, the detected at least one of the motion of and sounds associated with the at least one capacitor may be analyzed to identify predictive patterns and/or abnormalities, and the predictive patterns and/or abnormalities may be used to identify the possible stress conditions, risk state or aging state. For example, as illustrated in FIG. 3A, repeating patterns in the detected at least one of the motion of and sounds associated with the at least one capacitor may be identified and analyzed through Fourier analysis (as shown by the example Fast Fourier Transform (FFT) of the harmonics of an example signal in FIG. 3A). It will be appreciated by one of ordinary skill in the art that this is very convenient representation, as this may apply to vibration and/or sound patterns, as well as to stress/aging factors such as voltage harmonics. It is also a very simple model which enables the identification of new patterns (then a new spike location may start to become visible), or it may be very convenient to detect if the overall "noise level" increases (then the points would be scattered in all the x axis, and the relative height of the spikes will decrease). This will be well understood to anyone skilled in the art of statistics, data science, time domain calculations, etc.

In accordance with some embodiments of this disclosure, machine learning may be used to determine/detect abnormalities. For example, in one example implementation, there may be a learning period to determine what are "normal" characteristics/conditions for each capacitor of the at least one capacitor. Deviations from these "normal" characteristics/conditions may be indicative of abnormalities. It is understood that variations may exist during manufacture, and it is possible for one capacitor to have slightly different characteristics than another capacitor. Thus, for this reason, it may be helpful to determine a baseline (e.g., establish a "normal model" of the measurement at the commissioning step, or at first operations) for each capacitor of the at least one capacitor, and use this information to identify/monitor possible stress conditions, risk state or aging state associated with the at least one capacitor and associated components. One example of a baseline would be the frequency of sound and/or motion detected, in relation to the stress factors or running conditions (e.g., temperature, voltage level, current level, harmonics). There will be variations. These variations will be observed and can be defined as "normal" (for example, through statistics such as standard deviation) during the initial phase. Ongoing observation will then be learned and deemed "normal" on any slow trends (such as, for example, by learning a progressive evolution of the noise and/or vibration frequency, as long as it stays within the standard deviation). But any strong increase where, for example, the frequency jumps to a frequency which is six times higher than defined as normal, may be analyzed to detected outliers (for example, by calculating the sum of the mean frequency and adding three times the standard deviation to detect the outliers). This new frequency may be a single point, or become a new frequency. The above-discussed example illustrates detecting an "abnormal" running condition, either of short duration or as a new steady reference.

Figure 3B:
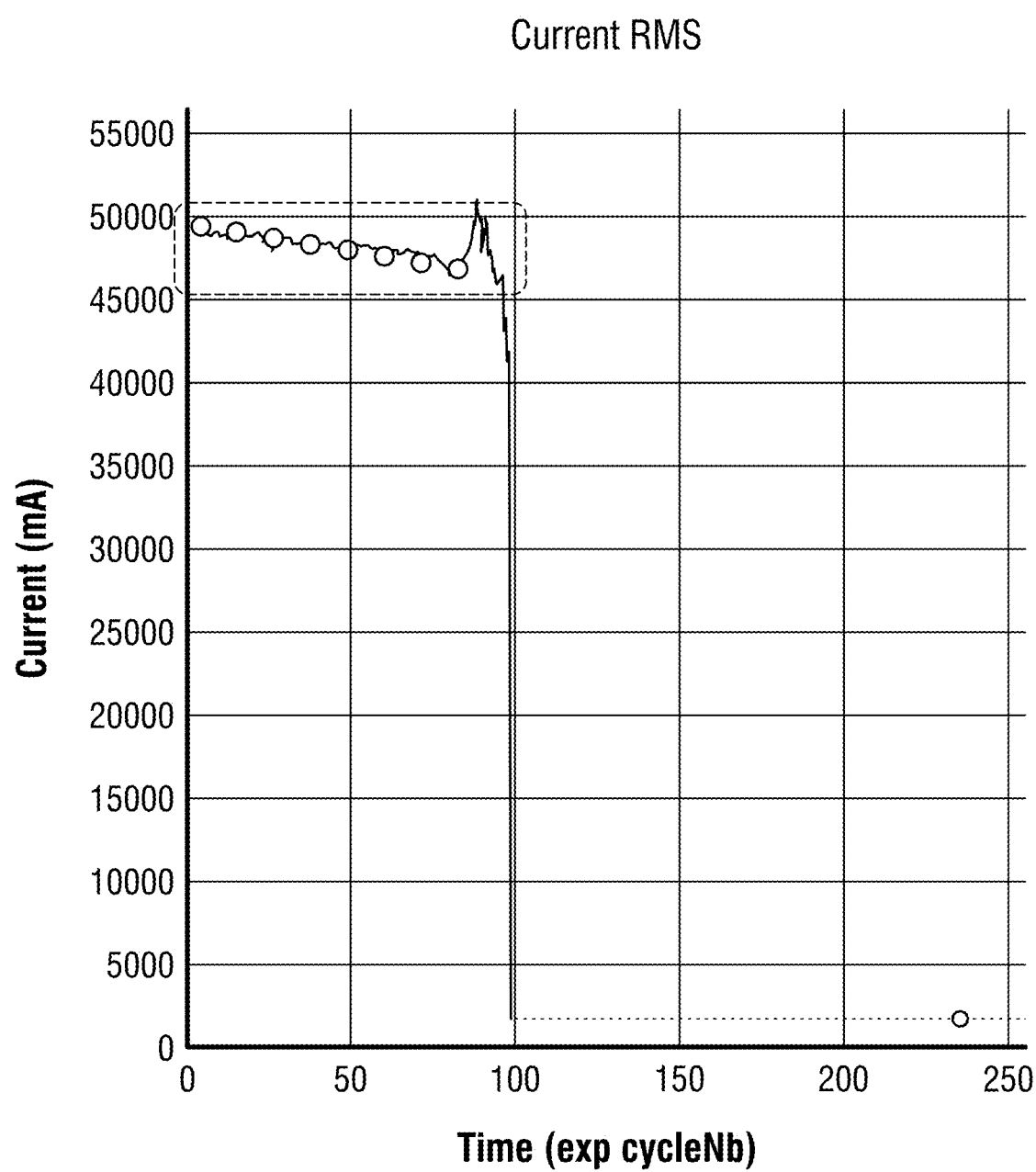
FIG. 3B illustrates current drop indicative of a stress condition, risk state or aging state in accordance with embodiments of this disclosure.

Referring to FIG. 3B, this figure illustrates slow trends of a decrease of current over time associated with a capacitor that may be indicative of possible stress conditions, risk state or aging state associated with the capacitor. It is apparent that the current level decreases until it shortly rises again before the protection mechanism cuts off the current. This shows the potential aging/risk level of the given capacitor as the system may infer what is a relative threshold of percentage of decrease from the initial current level at commissioning time. The learning of the current level may, for example, happen over a three week duration (in this example, the system may have learned that the initial state was 50 A). Then the system may define for the given capacitor that the threshold would be at 47.5 A to cut-off the capacitor. Here, in this illustration, we have the last period of operations without cutting off the capacitor (e.g., through a protection mechanism, which results in a current drop to 0). Triggering a protection mechanism is one example of an action that may be taken to reduce or eliminate possible stress conditions, risk state or aging state that are identified, as will be further appreciated from discussions in connection with blocks below.

Returning now to block 310 of method 300 shown in FIG. 3, it is understood that data associated with the detected at least one of the motion of and the sounds associated with the at least one capacitor that is analyzed to detect the possible stress conditions, risk state or aging state make take a variety of forms. For example, the data may take the form of logged data (e.g., rate per 10 seconds, or per minute or per hour or per day), event data (such as each time we detect motion/sound) or waveforms (current, power, voltages), etc.

At block 315, it is determined if possible stress conditions, risk state or aging state were identified at block 310. If it determined that possible stress conditions, risk state or aging state were identified at block 310, the method proceeds to block 320. Alternatively, if it is determined that no possible stress conditions, risk state or aging state were identified at block 310, the method may end in some embodiments, or return to block 305 (e.g., for detecting additional at least one of motion of and sounds associated with the at least one capacitor).

At block 320, impacts of the possible stress conditions, risk state or aging state on the at least one capacitor and associated components are determined/quantified. For example, it may be determined which capacitors of the at least one capacitor, and which components associated with the at least one capacitor, are impacted or affected by the identified possible stress conditions, risk state or aging state. For example, it is possible that one or more capacitors of the at least one capacitor may be impacted more or less than other capacitors of the at least one capacitor. Additionally, it is possible that one or more components associated with the at least one capacitor may be impacted more or less than other components associated with the at least one capacitor. These variations in impact may be due, for example, to the type(s) and severity(ies) of the possible stress conditions, risk state or aging state, proximity(ies) of the capacitor(s) and associated components to the possible stress conditions, risk state or aging state, tolerance level(s) of the capacitor(s) and associated components to the possible stress conditions, risk state or aging state, etc.). In one example implementation, the impacts of the possible stress conditions, risk state or aging state on the at least one capacitor and associated components are determined/quantified to indicate/estimate reduction in component lifetime of the at least one capacitor and associated components, potential hazards and risks levels associated with the at least one capacitor and associated components due to the possible stress conditions, risk state or aging state, etc.

At block 325, at least one action is taken to reduce or eliminate the possible stress conditions, risk state or aging state. As described earlier in this disclosure, the at least one action taken to reduce or eliminate possible stress conditions, risk state or aging state may take a variety of forms. For example, in one example implementation, the at least one action taken to reduce or eliminate the possible stress conditions, risk state or aging state includes decoupling one or more capacitors of the at least one capacitor from an electrical system including the at least one capacitor (e.g., for protection or safety of the capacitor(s) and/or other associated components). Additionally, in one example implementation, the at least one action may include triggering at least one alarm to indicate the possible stress or risks condition(s). In accordance with some embodiments of this disclosure, the at least one triggered alarm may be communicated audibly and/or visually (e.g., on a display device of a system user and/or operator) or sent to another system.

In accordance with some embodiments of this disclosure, one or more actions may be taken (e.g., automatically, semi-automatically and/or manually) in response to the at least one triggered alarm. For example, in one example implementation, at least one cooling device (e.g., fan, ventilation, HVAC mechanism, etc.) may be responsive to the at least one triggered alarm to reduce temperature of the at least one capacitor in response to the at least one triggered alarm indicating an over-temperature condition associated with the at least one capacitor. In accordance with some embodiments of this disclosure, this would be particularly useful in embodiments in which more than one capacitor in a capacitor bank including the at least one capacitor shows the same over heating condition. Another possible example would be to switch to another capacitor within the capacitor bank and to switch off the currently used capacitor.

For example, referring again to the cooling action(s), a control signal may be generated in response to determining at least one action should or must be taken to reduce or eliminate the possible stress conditions, risk state or aging state (e.g., the above-noted over-temperature condition), and the at least one cooling device may be responsive to the control signal to provide cooling to reduce temperature of the at least one capacitor. In accordance with some embodiments of this disclosure, the control signal may be generated by a control system and/or another system or device. The control system and/or other system or device may be coupled to, or include, or be provided in a sensing system or device (e.g., system for identifying and managing stress or risks conditions associated with at least one capacitor, the at least one motion and/acoustic sensing device, etc.). In embodiments in which the above-discussed at least one triggered alarm is communicated audibly and/or visually, the at least one triggered alarm may indicate/alert a user to potential actions to be taken to address the possible stress conditions, risk state or aging state (e.g., replacing capacitor(s) and/or associated components) that may be taken automatically, semi-automatically or manually.

In accordance with some embodiments of this disclosure, the at least one action is taken based, at least in part, on the impacts of the possible stress conditions, risk state or aging state determined at block 320. For example, the probable impacts of the possible stress conditions, risk state or aging state may be ranked, for example, as low impact, medium impact, and high impact. In accordance with some embodiments of this disclosure, the at least one action may be taken for select impact levels (e.g., medium and high impact) and/or be taken in order of impact (e.g., high impact before medium impact). Additionally, in accordance with some embodiments of this disclosure, the type of action taken may be selected based, at least in part, on the impact. For example, more severe/intense types of actions may be taken for capacitors and/or associated components that are subject to high impact stress conditions than capacitors and/or associated components that are subject to low impact stress conditions.

In another example implementation of the disclosed invention, the system may learn what action(s) to take from user(s). For example, user actions may be monitored and associated by the system using normal state of the art analytics to derive best possible action to associate to any specific risk state or aging or stress conditions, or combination of any of these. For example, the system may learn a plurality of different actions (e.g., four different actions). Each step may in this example may correspond to a risk state. For example, the system may learn that users acknowledge alarm(s) (e.g., triggered alarms) as a first step when first abnormal short duration events are detected. Then, as second action, the users may typically take another type of action by triggering a maintenance request and validating the maintenance report when vibration frequency increases beyond a certain pre-defined threshold. Then, when the vibration sensors detect for one specific capacitor that it reaches a second threshold, the system may infer that users change the settings in the controller to stop using this specific capacitor. Finally, the vibration sensors may detect that several capacitors all start over-stepping the given threshold. The system may then learn that users shut off the whole capacitor bank from an analysis of several capacitor banks which displayed this behavior. Another example may be exactly reversed, so that actions are pre-defined, but the system may learn the thresholds to trigger the corresponding action by calculating when the users take what actions. In one example implementation, when several cases of each action are taken or initiated by different users, the system may choose either the lowest threshold (e.g., too minimize the risk) or may do some calculations (for example take the mean value of when for each level of action was triggered) to learn (aka "infer") what the threshold should be used to trigger the next level(s) of action(s).

Subsequent to block 325, the method may end in some embodiments. In other embodiments, the method may return to block 305 (e.g., for collecting and analyzing additional/new motion data and/or sound data). In some embodiments in which the method ends after block 325, the method may be initiated again in response to user input and/or a control signal, for example.

It is understood that method 300 may include one or more additional blocks or steps in some embodiments. For example, in some embodiments method 300 may include a step for analyzing measured current(s) and/or voltage(s) and/or power associated with the at least one capacitor to identify (or aid with identifying) the possible stress conditions, risk state or aging state. For example, the measured current(s) may be analyzed for decreases in current over time, and the decreases in current over time may be indicative of a possible stress condition. The current(s) and/or voltage(s) and/or power may be measured, for example, by at least one current and/or voltage and/or power sensing device electrically coupled to the at least one capacitor. It is understood that any derived calculation from voltage and current measurements may then be leveraged and evaluated as indicative of stress conditions, of aging conditions or of risk conditions. Some already mentioned examples of such derived measurements are for example the Power factor, the phase angles between voltage and current signal, the reactive power, the capacitance, etc. In some embodiments, method 300 may also include a step for analyzing measured temperature(s) associated with the at least one capacitor to identify (or aid with identifying) the possible stress conditions, risk state or aging state. For example, the measured temperature(s) may be analyzed for increases in temperature over time, and the increases in temperature over time are indicative of a possible stress condition. The temperature(s) may be measured, for example, by at least one temperature sensing device proximate to the at least one capacitor. It is understood that many other types of sensing devices (e.g., electrochemical nose and/or other smell/odor sensor) may be used to identify (or aid with identifying) the possible stress conditions, risk state or aging state in accordance with embodiments of this disclosure.

It is understood that other parameters may additionally or alternatively be analyzed and used to identify and manage risk state, stress conditions or aging state associated with the at least one capacitor. For example, in one alternative embodiment of the disclosed invention, internal pressure of the at least one capacitor may additionally or alternatively be monitored to identify and manage risk state, stress conditions or aging state associated with the at least one capacitor. For example, referring to FIG. 4, a flowchart illustrates another example method 400 for identifying and managing risk state, stress conditions or aging state associated with the at least one capacitor. As illustrated in FIG. 4, the method 400 begins at block 405, where internal pressure of the at least one capacitor is monitored using at least one pressure sensing device. In embodiments in which the at least one capacitor includes at least one can type capacitor, for example, the at least one pressure sensing device may be coupled to at least one interior surface or element of the at least one can type capacitor in some embodiments. In other embodiments, the at least one pressure sensing device may be coupled to at least one exterior surface or protection mechanism of the at least one can type capacitor. In embodiments in which the at least one pressure sensing device is coupled to the at least one interior surface or one element of the at least one capacitor, for example, the internal pressure of the at least one capacitor may be directly measured by the at least one pressure sensing device. Additionally, in embodiments in which the at least one pressure sensing device is coupled to the at least one exterior surface or protection mechanism of the at least one capacitor, for example, the internal pressure of the at least one capacitor may be inferred by the at least one pressure sensing device (e.g., based on an analysis of the expansion and contraction of the exterior surface of the can type capacitor, or of the protection mechanism).

At block 410, subsequent to or while the internal pressure of the at least one capacitor is being measured, the monitored internal pressure is analyzed on at least one processing device (e.g., 230, shown in FIG. 2) coupled to the at least one pressure sensing device (e.g., 220, shown in FIG. 2) to identify pressure variations in the at least one capacitor (e.g., 210, shown in FIG. 2).

At block 415, it is determined if pressure variations were identified at block 410. If it determined that pressure variations were identified at block 410, the method proceeds to block 420. Alternatively, if it is determined that no pressure variations were identified at block 410, the method may end in some embodiments, or return to block 405 (e.g., for further monitoring of internal pressure associated with the at least one capacitor).

At block 420, it is determined if the identified pressure variations exceed a threshold or have a pattern or patterns indicative of an issue or possible or probable failure. In one example implementation of the disclosed invention, the threshold corresponds to a pressure level or pressure rate. Additionally, in one example implementation of the disclosed invention, a pattern or patterns of decreasing relative pressure level is indicative of risk of failure of existing electro-mechanical protection. As will be described later, in an air-tight capacitor, pressure should not decrease (for any comparable context of temperature and operations). Accordingly, if any pattern of increase in pressure is observed during operations, followed by a cycle of decrease in pressure, this is a clear indication of an air leak (as will be described further below). It is understood that further characterizations may occur at block 420 and other blocks. For example, the identified pressure variations may be characterized to determine if the at least one capacitor is air-tight or not air-tight. Additionally, the identified pressure variations may be characterized to identify at least one possible source of the identified pressure variations. In accordance with some embodiments of this disclosure, the characterizations are based, at least in part, on the analysis of the identified pressure variations to determine if the identified pressure variations exceed a threshold or have a pattern or patterns indicative of an issue or possible or probable failure.

Returning now to block 420, if it determined the identified pressure variations exceed a threshold or have a pattern or patterns indicative of an issue or possible or probable failure, the method proceeds to block 425. Alternatively, if it is determined the identified pressure variations do not exceed a threshold or have a pattern or patterns indicative of an issue or possible or probable failure, the method may end in some embodiments, or return to block 405 (e.g., for further monitoring of internal pressure associated with the at least one capacitor).

At block 425, at least one protection mechanism may be triggered to reduce or significantly eliminate the possibility of hazardous conditions resulting from the identified pressure variations. For example, an alarm may be sent to maintenance to replace this capacitor. In another case, the controller may stop using this specific capacitor. Or, in a worst risk scenario in one example implementation, the controller may simply stop the whole capacitor bank and send an alarm to user, providing an incident prevention report so users may take or perform one or more actions (e.g., change part or all of capacitor bank).

Subsequent to block 425, the method may end in some embodiments. In other embodiments, the method may return to block 405 (e.g., for further monitoring of internal pressure associated with the at least one capacitor). In some embodiments in which the method ends after block 425, the method may be initiated again in response to user input and/or a control signal, for example.

It will be appreciated by one of ordinary skill in the art that method 400 described above additionally provides for analyzing measured internal pressure in conjunction with temperature and other parameters (e.g., time) to detect and monitor leakage & thereby detect capacitors that are not air-tight. In accordance with embodiments of this disclosure, by adding a pressure sensor, an "end-of-life" estimate may be provided using cumulative pressure. Additionally, the method may increase operational life of the at least one capacitor by optimizing "° C./pressure".

As is known, the normal operation of air-tight/air-sealed capacitor container will only allow for pressure increase (for a given temperature). There is currently a protection mechanism inside our capacitors to trip when the internal pressure exceeds a certain level. If a capacitor is not "air-tight", pressure may regularly cycle through pressure build-up and then recede to low pressure values, due to leakage. The protection mechanism may not be triggered. In this case, the capacitor may go into a dangerous state, which may result in fire or an explosion, for example. It is understood that a capacitor may not be "air-tight" either due to mis-handling (shock, bumps, during transportation or installation) or due to manufacturing quality issues. The idea is to identify "pressure diminishing" to identify non-air-tight/non-air-sealed capacitors. In one example implementation of the disclosure invention, a pressure sensor will need to be added to the capacitor to measure pressure. Example benefits provided include preventing fire and explosion risks and improving capacitor life, for example.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits, components, equipment and techniques sought to be protected herein are not limited to use in the example applications described herein but rather, may be useful in substantially any application where it is desired to identifying and managing stress conditions, risk state or aging state associated with at least one capacitor. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for identifying and managing stress conditions, risk state or aging state associated with at least one capacitor associated with an electrical device in an electrical power system, comprising:
    detecting at least one of motion and sounds associated with the at least one capacitor;
    analyzing at least the detected at least one of motion and sounds associated with the at least one capacitor to identify possible stress conditions, risk state or aging state associated with the at least one capacitor and associated components;
    in response to identifying possible stress conditions, risk state or aging state, determining probable impacts of the possible stress conditions, risk state or aging state on the at least one capacitor and associated components; and
    taking at least one action to reduce or eliminate the possible stress conditions, risk state or aging state based, at least in part, on the determined impacts.

2. The method of claim 1, wherein frequencies of occurrence of the detected sounds are analyzed to the identify the possible stress conditions, risk state or aging state.

3. The method of claim 1, wherein pitches of the detected sounds are analyzed to the identify the possible stress conditions, risk state or aging state.

4. The method of claim 1, wherein the detected at least one of the motion and sounds is/are analyzed to identify at least one of predictive patterns and abnormalities, with the at least one of the predictive patterns and abnormalities being used to identify the possible stress conditions, risk state or aging state trends and probable impacts.

5. The method of claim 1, further comprising: coupling at least one of a motion sensing device and an acoustic sensing device to at least one surface of or proximate to the at least one capacitor or a room environment proximate to the at least one capacitor, prior to detecting the at least one of motion and sounds associated with the at least one capacitor.

6. The method of claim 5, wherein the at least one acoustic sensing device includes at least one transducer configured to convert detected sounds associated with the at least one capacitor to corresponding electrical signals, and the electrical signals are analyzed to identify the possible stress conditions, risk state or aging state.

7. The method of claim 6, wherein the sounds associated with the at least one capacitor are amplified by at least one amplification device prior to being detected by the at least one acoustic sensing device.

8. The method of claim 7, wherein the at least one amplification device is positioned proximate to the at least one capacitor.

9. The method of claim 1, further comprising: analyzing measured current(s) and/or voltage(s) and/or power associated with the at least one capacitor to identify the possible stress conditions, risk state or aging state.

10. The method of claim 9, wherein the measured current(s) is/are analyzed for decreases in current over time, wherein the decreases in current over time are indicative of a possible stress condition.

11. The method of claim 9, wherein the current(s) and/or voltage(s) and/or power is/are measured by at least one current and/or voltage and/or power sensing device electrically coupled to the at least one capacitor.

12. The method of claim 1, further comprising: analyzing measured temperature(s) associated with the at least one capacitor to identify the possible stress conditions, risk state or aging state.

13. The method of claim 12, wherein the measured temperature(s) is/are analyzed for increases in temperature over time, wherein the increases in temperature over time are indicative of a possible stress condition or risks state or aging state.

14. The method of claim 12, wherein the temperature(s) is/are measured by at least one temperature sensing device proximate to the at least one capacitor.

15. The method of claim 1, wherein the at least one action includes decoupling one or more capacitors of the at least one capacitor from an electrical system including the at least one capacitor.

16. The method of claim 1, wherein the at least one action includes triggering at least one alarm to indicate the possible stress conditions, risk state or aging state.

17. The method of claim 1, wherein the at least one action includes triggering at least one cooling device to reduce temperature of the at least one capacitor.

18. The method of claim 1, wherein the at least one capacitor includes a plurality of capacitors.

19. The method of claim 18, wherein the plurality of capacitors are provided in at least one capacitor bank.

20. The method of claim 1, further comprising: analyzing monitored internal pressure of the at least one capacitor to identify the possible stress conditions, risk state or aging state.

21. The method of claim 20, wherein the monitored internal pressure is analyzed to identify pressure variations in the at least one capacitor, with the identified pressure variations being indicative of the possible stress conditions, risk state or aging state.

22. The method of claim 21, further comprising: characterizing the identified pressure variations to determine if the at least one capacitor is air-tight or not air-tight.

23. The method of claim 21, further comprising: characterizing the identified pressure variations to identify at least one possible source of the identified pressure variations.

24. The method of claim 21, wherein decreasing relative pressure level is indicative of risk of failure of existing electro-mechanical protection(s).

25. The method of claim 21, further comprising:
    in response to the identified pressure variations exceeding a threshold or having a pattern or patterns indicative of an issue or possible or probable failure, triggering at least one protection mechanism to reduce or significantly eliminate the possibility of hazardous conditions resulting from the identified pressure variations.

26. The method of claim 25, wherein the threshold corresponds to a pressure level or pressure rate.

27. A system for identifying and managing stress conditions, risk state or aging state associated with at least one capacitor associated with electrical equipment in an electrical power system, comprising:
- at least one of a motion sensing device and an acoustic sensing device coupled to at least one surface proximate to the at least one capacitor, the at least one of the motion sensing device and the acoustic sensing device configured to detect at least one of motion and sounds associated with the at least one capacitor; and
- at least one processing device coupled to the at least one of the motion sensing device and the acoustic sensing device, the at least one processing device configured to:
  - analyze at least the detected at least one of motion and sounds associated with the at least one capacitor to identify possible stress conditions, risk state or aging state associated with the at least one capacitor and associated components;
  - in response to identifying possible stress conditions, risk state or aging state, determine impacts of the possible stress conditions, risk state or aging state on the at least one capacitor and associated components; and
  - take at least one action to reduce or eliminate the possible stress conditions, risk state or aging state based, at least in part, on the determined impacts.

28. The system of claim 27, further comprising:
at least one control device coupled to the at least one processing device and the at least one capacitor, the at least one control device configured to:
  - receive at least one control signal from the processing device in response to the at least one processing device identifying the possible stress conditions, risk state or aging state; and
  - take the at least one action to reduce or eliminate the possible stress conditions, risk state or aging state in response to receiving the at least one control signal.

29. The system of claim 28, wherein the at least one action includes decoupling one or more capacitors of the at least one capacitor from an electrical system including the at least one capacitor.

30. The system of claim 28, wherein the at least one action includes triggering at least one alarm to indicate the possible stress conditions, risk state or aging state.

31. The system of claim 28, wherein the at least one action includes triggering at least one cooling device to reduce temperature of the at least one capacitor in response to receiving the control signal.

* * * * *